United States Patent [19]
Baschirotto et al.

[11] Patent Number: 6,163,176
[45] Date of Patent: Dec. 19, 2000

[54] AC-COUPLED DRIVER WITH WIDE OUTPUT DYNAMIC RANGE

[75] Inventors: Andrea Baschirotto, Tortona; Giovanni Frattini, Travaco' Siccomario, both of Italy

[73] Assignee: STMicroelectronics S.r.l., Agrate Brianza, Italy

[21] Appl. No.: 09/185,925

[22] Filed: Nov. 4, 1998

[30] Foreign Application Priority Data

Nov. 6, 1997 [IT] Italy ................................. MI97A2484

[51] Int. Cl.[7] ............................................. H03B 1/00
[52] U.S. Cl. ........................ 327/108; 327/109; 327/111; 327/112
[58] Field of Search ................... 327/108, 109, 327/111, 112

[56] References Cited

U.S. PATENT DOCUMENTS 5,546,029  8/1996  Koke ........................................ 327/108
5,900,783  5/1999  Dasgupta ................................ 330/264

*Primary Examiner*—Margaret R. Wambach
*Assistant Examiner*—Cassandra Cox
*Attorney, Agent, or Firm*—Theodore E. Galanthay; Allen, Dyer, Doppelt, Milbrath & Gilchrist, P.A.

[57] ABSTRACT

An AC-coupled driver comprises a drain output stage in which the quiescent-state current is set by a current mirror, and by a bias current for the current mirror. The drain output stage includes a DC coupling connected to the current mirror by a capacitive-resistive network. The DC coupling allows the drain output stage to deliver a high current following input of an AC voltage signal into the AC-coupled driver.

43 Claims, 1 Drawing Sheet

AC-COUPLED DRIVER WITH WIDE OUTPUT DYNAMIC RANGE

FIELD OF THE INVENTION

The present invention relates to the field of electronic circuits, and more particularly, to an AC-coupled driver circuit.

BACKGROUND OF THE INVENTION

Conventional drivers are normally used to drive small loads. It is usually desirable to have a highly controllable current level in the output branch of the driver in a quiescent state, and a high peak current level with input voltage signals having a wide peak-to-peak variation. Accordingly, it is necessary to use a class AB output stage for the driver to provide high peak currents.

Two approaches are currently used to provide the final stage of a line driver to provide the current. One approach is the use of a source output, and the second approach is the use of a drain output. FIGS. 1 and 2 respectively illustrate the two circuit configurations for a final stage with a source output, and for a final stage with a drain output.

The circuit of FIG. 1 includes a source output stage in which a first branch comprises a first pair of CMOS transistors formed by a first NMOS transistor 1 and a first PMOS transistor 2. The NMOS transistor 1 has a drain terminal connected to its gate terminal, and the drain is also connected to the supply voltage Vdd. A current source 3 is interposed between the supply voltage Vdd and the NMOS transistor 1. The source terminal of the transistor 1 is connected to the source terminal of the PMOS transistor 2. The PMOS transistor 2 has a drain terminal connected to its gate terminal, and the drain is also connected to ground. A current source 4 is interposed between ground and the PMOS transistor 2.

A second branch of the output stage comprises a pair of MOS transistors 5 and 6, respectively of the n-type and of the p-type. The pair of MOS transistors 5, 6 are series-connected between the supply voltage Vdd and ground. Respective gate terminals of the pair of MOS transistors 5, 6 are connected to respective gate terminals of the transistors 1, 2.

With this configuration, the quiescent-state (or standby) current level is controlled accurately since there is a 1:1 mirroring ratio between the first branch and the second branch. Therefore, the current in the second branch is equal to the current flowing in the first branch. However, this type of output stage imposes a drawback of not providing an adequate output dynamic range for an input signal Vin having a large peak-to-peak amplitude. The output dynamic range is limited to Vdd-2*Vth-4*Vov. Vth is the threshold voltage of the MOS transistors of the second branch, and Vov is the overdrive voltage. Accordingly, this approach is not acceptable when one wishes to have, as in this case, a wide output dynamic range (working with low supply voltages on the order of 3–3.3 volts).

The circuit of FIG. 2 includes a drain output comprising a pair of MOS transistors of the p-type and of the n-type, respectively designated by the reference numerals 7 and 8. The pair of MOS transistors 7, 8 are series-connected between the supply voltage Vdd and ground. These transistors 7, 8 operate in an opposite manner since the output dynamic range is high (equal to Vdd-2*Vov), but the current level cannot be easily controlled unless complex control structures are implemented.

SUMMARY OF THE INVENTION

An object of the present invention is to provide an AC-coupled driver capable of supplying a high peak current, and at the same time having a wide output dynamic range. Another object of the present invention is to provide an AC-coupled driver which can be used, if sized appropriately, for input signals having a frequency which can vary over a wide range.

Yet another object of the present invention is to provide an AC-coupled driver in which the output stage has a very low current in standby conditions, and is capable of supplying the load with a peak current considerably higher than the low current when a signal is applied thereto. Another object of the present invention is to provide an AC-coupled driver that is highly reliable and relatively easy to manufacture at competitive costs.

These objectives and others which will become apparent hereinafter are achieved by an AC-coupled driver comprising a drain output stage in which a quiescent-state current is set by a current mirror, and by a bias current for the current mirror. The drain output stage has a DC coupling connected to the current mirror by means of a capacitive-resistive network. The DC coupling allows the drain output stage to deliver a high current following the input of an AC voltage signal into the AC-coupled driver.

BRIEF DESCRIPTION OF THE DRAWINGS

Further characteristics and advantages of the present invention will become apparent from the following detailed description of a preferred, but not exclusive, embodiment of the driver according to the invention, illustrated only by way of non-limitative examples in the accompanying drawings, wherein.

DETAILED DESCRIPTION OF THE PREFERRED EMBODIMENTS

Figure 1:
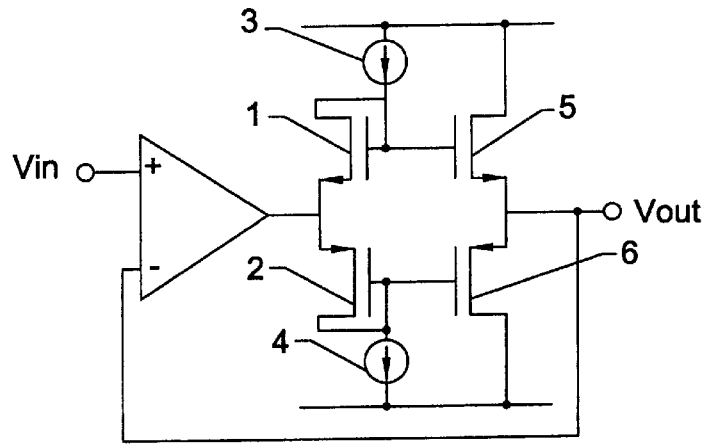
FIG. 1 is a view of a first embodiment of a final stage of a class AB driver, according to the prior art.
Figure 2:
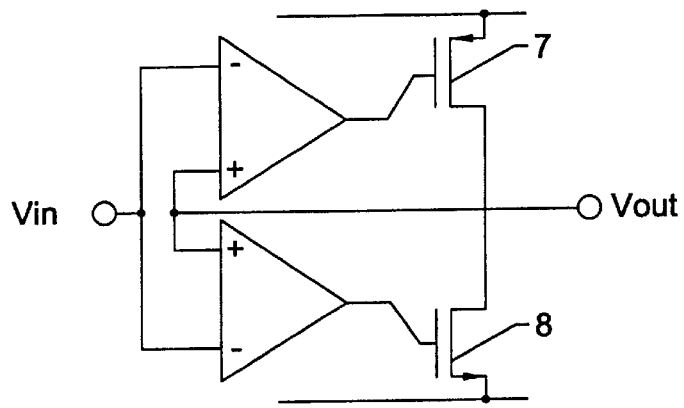
FIG. 2 is a view of a second embodiment of a final stage of a class AB driver, according to the prior art.
Figure 3:
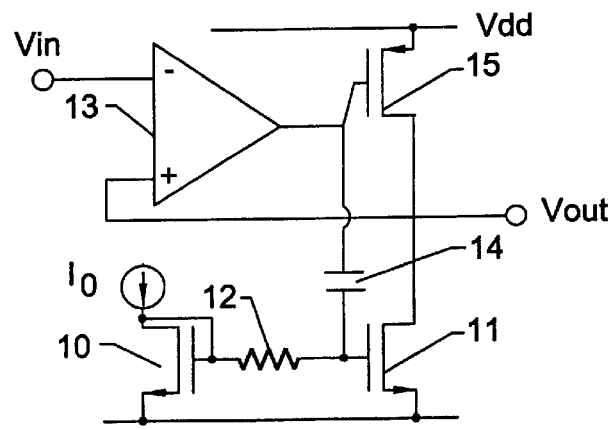
FIG. 3 is a view of an AC-coupled driver, according to the present invention.

FIG. 3 is a view of an AC-coupled driver, according to the present invention. The AC-coupled driver comprises a drain output stage which has an NMOS current mirror including a first transistor 10 and a second transistor 11. The first transistor 10 is biased by a current source Io. A source terminal of the first transistor 10 is connected to ground, and a drain terminal of the first transistor 10 is connected to its gate terminal.

A resistor 12 is interposed between the gate terminals of the two transistors 10 and 11. In the second transistor 11, the source terminal is connected to ground, and its drain terminal is connected to the drain terminal of a P-type MOS transistor 15. The P-type MOS transistor 15 is output-connected to the driver 13 by its gate terminal, and is connected, by its source terminal, to the supply voltage Vdd.

A capacitor 14 is connected between the gate terminal of the PMOS transistor 15 and the gate terminal of the NMOS transistor 11. The standby current of the output stage of the driver 13 is set by the NMOS mirror 10, 11 and by the current Io. The NMOS transistors 10 and 11 do not require a gate current for their biasing, and accordingly, the resistor 12 has no effect on biasing. Furthermore, in a DC mode, the resistor 12 and the capacitor 14 have no effect on biasing.

The output stage operates like a class A output stage for input signals Vin having a frequency that is lower than the cutoff frequency set by the resistor 12 and by the capacitor 14. For signals at a frequency that is higher than the high-pass cutoff frequency (which is preset), the output stage must supply a high current. Accordingly, the output stage has a DC coupling using the PMOS transistor 15, and an AC coupling using the NMOS transistor 11. In the DC mode, the quiescent current is determined by the current Io by virtue of the NMOS mirror.

In the AC mode, the PMOS transistor 15, the resistor 12 and the capacitor 14 are effected. The frequency associated with the time constant must always be lower than the lowest frequency of the input signal Vin. The time constant is defined by the product of the value of the resistor 12 and of the value of the capacitor 14. This may require the use of a resistor having a very high value. A high value resistor can be easily implemented by a transistor operating in the linear region. Advantageously, the transistor is provided with a W/L size ratio lower than 1.

Finally, the capacitor 14 must have the highest possible capacitance to lower the high-pass cutoff frequency, as previously defined. This allows use of the output stage with low-frequency signals, thus expanding the useful frequency range. A high capacitance for the capacitor 14, however, does not lead to an additional capacitive load at the output of the stage that drives the driver. This is due to the capacitor 14 being series-connected to the gate-source capacitor of the NMOS transistor 11. Accordingly, the capacitance that is seen by the output is that of the gate-source capacitor.

In practice, it has been observed that the driver according to the invention fully achieves the intended objectives since it obtains, in a quiescent state, a controllable current while at the same time having a wide dynamic range for the output voltage. A current Io having a value that is considerably lower than the peak current is required in the output from the output stage of the driver to drive a small load with an input signal having wide peak-to-peak variations.

Numerous modifications and variations can be made to the driver, all of which are within the scope of the invention. For example, it is possible to increase the value of the resistor 12 instead of increasing the value of the capacitor 14 to lower the high-pass cutoff frequency. This can also be achieved by providing the resistor 12 outside the circuit, thus allowing an easy way to provide a resistor having a chosen value. Finally, all the elements may be replaced with other technically equivalent elements. The Italian Patent Application No. MI97A002484, from which this application claims priority, is incorporated herein by reference in its entirety.

What is claimed is:

1. An AC-coupled driver comprising:
   a driver; and
   a drain output stage connected to said driver and comprising
      a current mirror comprising first and second transistors,
      a capacitive-resistive network connected to said current mirror and comprising a resistor connected between control terminals of said first and second transistors and a capacitor connected to said resistor, and
      a DC-coupling device connected to said capacitor for allowing said drain output stage to deliver a high current following an AC voltage input signal into said driver.

2. An AC-coupled driver according to claim 1, wherein said current mirror further comprises a biasing current source.

3. An AC-coupled driver according to claim 1, wherein said first and second transistors each comprises an n-type MOS transistor, and respective source terminals of each of said first and second n-type MOS transistors are connected to ground.

4. An AC-coupled driver according to claim 3, further comprising a current source connected to a drain of said first n-type MOS transistor for biasing same.

5. An AC-coupled driver according to claim 1, wherein said DC-coupling device comprises a third transistor.

6. An AC-coupled driver according to claim 5, wherein said capacitor is connected between the control terminal of said second transistor and a control terminal of said third transistor, and wherein a conduction terminal of said third transistor is connected to a conduction terminal of said second transistor.

7. An AC-coupled driver according to claim 5, wherein said third transistor comprises a p-type MOS transistor with a source terminal connected to a supply voltage.

8. An AC-coupled driver according to claim 1, wherein a frequency corresponding to a time constant of said capacitive-resistive network is lower than a frequency of an input signal.

9. An AC-coupled driver according to claim 1, wherein said resistor is a transistor for operating in a linear region.

10. An AC-coupled driver according to claim 9, wherein said transistor has a W/L ratio lower than about 1.

11. An AC-coupled driver according to claim 1, further comprising an integrated circuit package containing said current mirror and said DC coupling device; and wherein said resistor is external to said integrated circuit package.

12. An AC-coupled driver comprising:
    a driver; and
    a drain output stage connected to said driver and comprising
       a current mirror,
       a capacitive-resistive network connected to said current mirror and comprising a resistor and a capacitor connected together, and
       a first transistor connected to said capacitor for allowing said drain output stage to deliver a high current following an AC voltage input signal into said driver,
    said capacitor being connected between a control terminal of said first transistor and said current mirror.

13. An AC-coupled driver according to claim 12, wherein said current mirror further comprises a biasing current source.

14. An AC-coupled driver according to claim 12, wherein said current mirror comprises a second and a third transistor, a control terminal of each said second and third transistors are connected by said resistor, and respective conduction terminals of each of said second and third transistors are connected to ground.

15. An AC-coupled driver according to claim 14, wherein said second and third transistors each comprises an n-type MOS transistor; and further comprising a current source connected to a drain of said second n-type MOS transistor for biasing same.

16. An AC-coupled driver according to claim 15, wherein said first transistor comprises a p-type MOS transistor, and wherein said capacitor is connected between a gate terminal of said third n-type MOS transistor and the control terminal of said first p-type MOS transistor, and wherein a drain terminal of said first p-type MOS transistor is connected to a drain terminal of said third n-type MOS transistor.

17. An AC-coupled driver according to claim 12, wherein said first transistor comprises a conduction terminal connected to a supply voltage.

18. An AC-coupled driver according to claim 12, wherein a frequency corresponding to a time constant of said capacitive-resistive network is lower than a frequency of an input signal.

19. An AC-coupled driver according to claim 12, wherein said resistor is a transistor for operating in a linear region.

20. An AC-coupled driver according to claim 19, wherein said transistor has a W/L ratio lower than about 1.

21. An AC-coupled driver according to claim 12, further comprising an integrated circuit package containing said current mirror and said first transistor; and wherein said resistor is external to said integrated circuit package.

22. An AC-coupled driver comprising:
   a driver; and
   a drain output stage connected to said driver and comprising
      a current mirror comprising first and second transistors,
      a capacitive-resistive network connected to said current mirror and comprising a resistor connected between control terminals of said first and second transistors and a capacitor connected to said resistor,
      a third transistor connected to said capacitor for allowing said drain output stage to deliver a high current following an AC voltage input signal into said driver, and
      said capacitor being connected between a control terminal of said third transistor and the control terminal of said second transistor.

23. An AC-coupled driver according to claim 12, wherein said drain output stage further comprises a capacitive-resistive network connecting said p-type MOS transistor to said current mirror.

24. An AC-coupled driver according to claim 22, wherein said current mirror further comprises a biasing current source.

25. An AC-coupled driver according to claim 22, wherein said first and second transistors each comprises an n-type MOS transistor, and respective source terminals of each of said first and second n-type MOS transistors are connected to ground.

26. An AC-coupled driver according to claim 25, further comprising a current source connected to a drain of said first n-type MOS transistor for biasing same.

27. An AC-coupled driver according to claim 25, wherein said third transistor comprises a p-type MOS transistor, and wherein a drain terminal of said third p-type MOS transistor is connected to a drain terminal of said second n-type MOS transistor.

28. An AC-coupled driver according to claim 22, wherein said third transistor comprises a conduction terminal connected to a supply voltage.

29. An AC-coupled driver according to claim 22, wherein a frequency corresponding to a time constant of said capacitive-resistive network is lower than a frequency of an input signal.

30. An AC-coupled driver according to claim 22, wherein said resistor is a transistor for operating in a linear region.

31. An AC-coupled driver according to claim 30, wherein said transistor has a W/L ratio lower than about 1.

32. An AC-coupled driver according to claim 22, further comprising an integrated circuit package containing said current mirror and said third transistor; and wherein said resistor is external to said integrated circuit package.

33. A method for providing a wide output dynamic range for an AC-coupled driver, the method comprising the steps of:
   providing a driver; and
   connecting a drain output stage to the driver, further comprising the steps of
      providing a current mirror comprising first and second transistors,
      connecting a capacitive-resistive network to the current mirror, the capacitive-resistive network comprising a resistor connected between control terminals of the first and second transistors and a capacitor connected to the resistor, and
      connecting a DC-coupling device to the capacitor for allowing the drain output stage to deliver a high current following an AC voltage input signal into the driver.

34. A method according to claim 33, further comprising the step of connecting a capacitive-resistive network between the DC-coupling and the current mirror.

35. A method according to claim 33, further comprising the step of biasing the current mirror.

36. A method according to claim 34, wherein the first and second transistors each comprises an n-type MOS transistor, the method further comprising
   connecting respective source terminals of each first and second n-type MOS transistor to ground.

37. A method according to claim 36, further comprising the step of connecting a current source to a drain of the first n-type MOS transistor for biasing same.

38. A method according to claim 33, wherein the DC-coupling device comprises a third transistor.

39. A method according to claim 38, wherein
   the capacitor is connected between the control terminal of the second transistor and a control terminal of the third transistor; and the method further comprising
      connecting a conduction terminal of the third transistor to a conduction terminal of the second transistor.

40. A method according to claim 38, wherein the third transistor comprises a p-type MOS transistor; and the method further comprising the step of connecting a source terminal of the third p-type MOS transistor to a supply voltage.

41. A method according to claim 33, wherein a frequency corresponding to a time constant of said capacitive-resistive network is lower than a frequency of an input signal.

42. A method according to claim 33, wherein the resistor is a transistor for operating in a linear region.

43. A method according to claim 42, wherein the transistor has a W/L ratio lower than about 1.

* * * * *

UNITED STATES PATENT AND TRADEMARK OFFICE
CERTIFICATE OF CORRECTION

PATENT NO.    : 6,163,176
DATED         : December 19, 2000
INVENTOR(S)   : Andrea Baschirotto, Giovanni Frattini Page 1 of 1

It is certified that error appears in the above-identified patent and that said Letters Patent is hereby corrected as shown below:

Column 5,
Line 29, delete: "according to claim 12" insert -- according to claim 22 --

Signed and Sealed this

Twenty-fifth Day of September, 2001

*Attest:*

*Attesting Officer*

NICHOLAS P. GODICI
*Acting Director of the United States Patent and Trademark Office*